United States Patent
Neary

[11] Patent Number: 5,882,823
[45] Date of Patent: Mar. 16, 1999

[54] FIB REPAIR METHOD

[75] Inventor: Timothy Edward Neary, Essex Junction, Vt.

[73] Assignee: International Business Machines Corporation, Armonk, N.Y.

[21] Appl. No.: 861,294

[22] Filed: May 21, 1997

[51] Int. Cl.⁶ .................................................. G03F 9/00
[52] U.S. Cl. ........................................ 430/5; 204/192.34
[58] Field of Search ............................... 430/5, 312, 314; 216/58; 204/192.34

[56] References Cited

U.S. PATENT DOCUMENTS

| 4,457,803 | 7/1984 | Takigawa | 156/626 |
| 4,548,883 | 10/1985 | Wagner | 430/5 |
| 4,587,184 | 5/1986 | Schneider-gmelch et al. | 430/5 |
| 5,085,957 | 2/1992 | Hosono | 430/5 |
| 5,272,024 | 12/1993 | Lin | 430/5 |
| 5,273,849 | 12/1993 | Harriott et al. | 430/5 |
| 5,382,484 | 1/1995 | Hosono | 430/5 |
| 5,405,721 | 4/1995 | Pierrat | 430/5 |
| 5,439,763 | 8/1995 | Shimase et al. | 430/5 |
| 5,443,931 | 8/1995 | Watanabe | 430/5 |
| 5,464,713 | 11/1995 | Yoshioka et al. | 430/5 |
| 5,468,337 | 11/1995 | Miyatake | 216/24 |
| 5,482,802 | 1/1996 | Celler et al. | 430/5 |
| 5,549,995 | 8/1996 | Tanaka et al. | 430/5 |

OTHER PUBLICATIONS

M. Levenson et al, "Improving Resolution in Photolithography with a Phase–Shifting Mask", IEEE Transactions on Electron Devices, vol. ED–29, No. 12, Dec. 1982, pp. 1828–2836.

T. Onodera et al., "Conjugate Twin–Shifter Phase Shift Method for High Resolution Lithography", OKI Technical Review 148, vol. 59, Dec. 1993, pp. 47–50.

H. Ohtsuka et al., "Conjugate Twin–Shifter for the New Phase Shift Method to High Resolution Lithography", SPIE vol. 1463 Optical/Laser Microlithography IV (1991), pp. 112–123.

P. Agnello et al., "Phase Edge Lithography for Sub 0.1 um Electrical Channel Length in a 200 MM Full CMOS Process", 1995 symposium on VLSI Technology Digest of Technical Papers, pp. 79–80.

T. D. Cambria et al., "Mask and Circuit Repair with Focused–Ion Beams", Solid State Technology, Sep. 1987, pp. 133–136.

Primary Examiner—S. Rosasco
Attorney, Agent, or Firm—James M. Leas

[57] ABSTRACT

A method of repairing a defect on a substrate includes the steps of shining a beam, such as a focused ion beam, on a substrate to remove a portion of the defect and to leave a thin wall of the defect, and then providing a second removal step, such as an isotropic etch, to substantially remove the thin wall, wherein the second removal step comprises a process different from the original shining step.

36 Claims, 14 Drawing Sheets

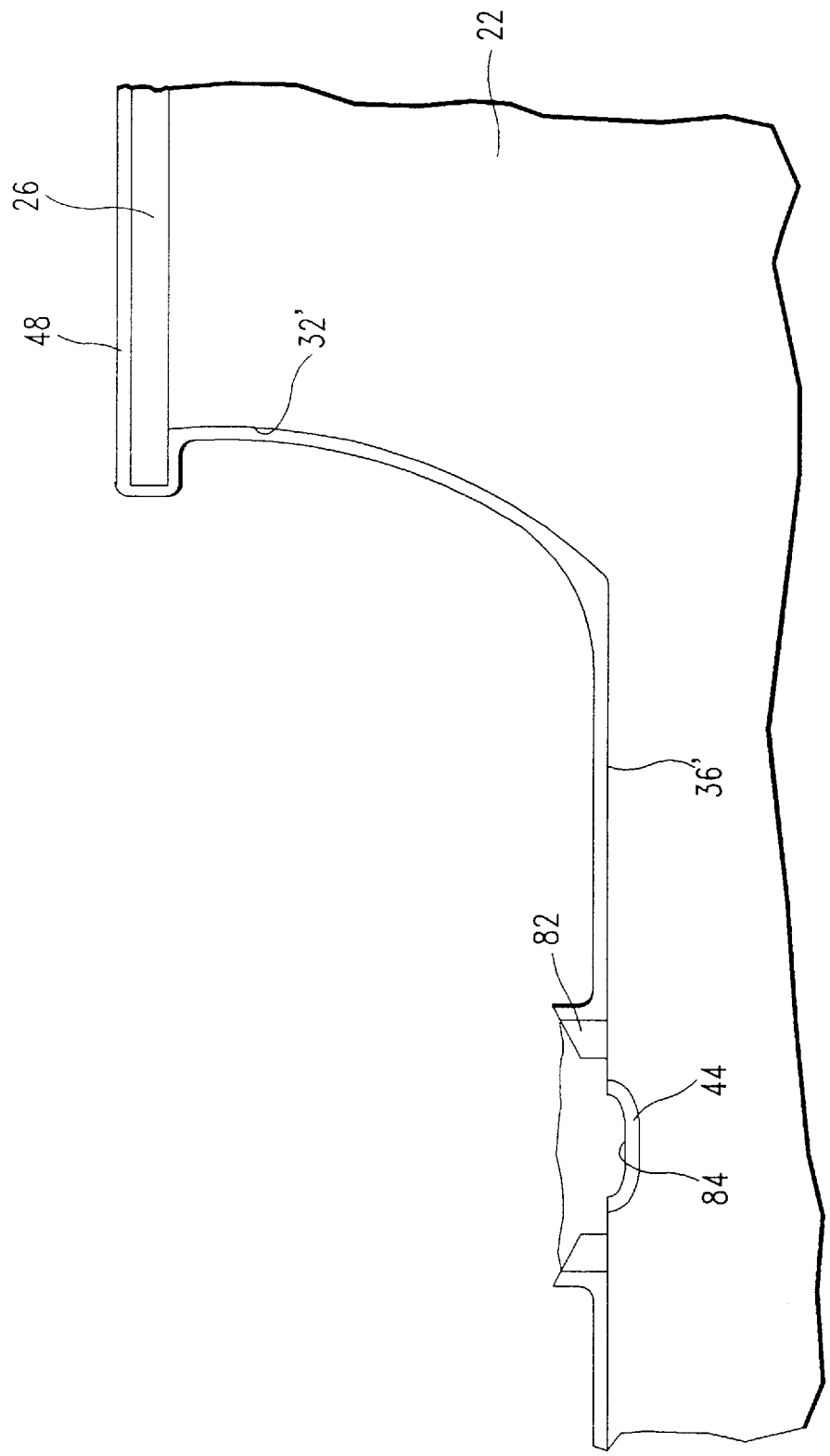

FIB REPAIR METHOD

FIELD OF THE INVENTION

This invention generally relates to a method of repairing masks using a focused ion beam (FIB) tool. More particularly, it relates to a method of removing defects in the quartz of phase shift masks.

BACKGROUND OF THE INVENTION

Phase shift masks include attenuator, rim shift, and alternating types. While attenuator masks provide a layer of material on the quartz substrate, rim shift and alternating phase shift masks can involve etching the quartz substrate itself to provide differential phase transmission. One of the key problems in fabricating any of these masks is the difficulty of repairing defects formed during the mask manufacturing process. A defect may arise because of the presence of a minute particle on the quartz substrate, in the chromium layer on the quartz substrate, or in the photosensitive material used to pattern the mask. The problem is particularly severe where the quartz substrate is etched because heretofore there has been no repair or rework method available for defects in the quartz. Thus, defects formed in the quartz after the etch step have been regarded as unrepairable, and masks with quartz defects have been scrapped. Because defects are pervasive in each of the steps of mask fabrication, the inability to repair quartz defects has sharply limited the ability to fabricate alternating phase shift masks and rim shift masks that require quartz etching.

In fabricating these alternating phase shift masks, a blanket layer of chromium on the quartz substrate is first photolithographically patterned to provide desired shapes of chrome, such as boxes and lines, and spaces there between. Then the quartz is etched in locations defined by the spaces between chromium patterns.

The etch is carefully controlled to create trenches having a specified depth so light passing through the region with a trench passes through a quartz substrate thinned compared to light passing through a neighboring region that has the full thickness of quartz, the difference in thicknesses providing a 180° phase difference in the light transmitted by each. Because of the interference of the out of phase light there is a significant intensification of contrast between adjacent regions when light is shined through the mask, and this intensification of contrast provides the ability to resolve significantly smaller structures than can be achieved without phase shifting. Typically, the etch depth is controlled to provide a relative shift between the two neighboring regions of half of the wavelength of the light used with the mask to expose semiconductor wafers, thereby providing the 180° phase difference.

Defects in the etching of the quartz are analogous to the opaque and clear defects of standard masks, described in commonly assigned co-pending patent application Ser. No. 08/786,061, (the '061 application). Thus, analogous to opaque defects are regions where quartz should have been etched but was not etched. In these regions of the mask there remain unwanted columns of full thickness quartz. Analogous to clear defects, are regions where quartz was etched but should not have been etched. In this case pits or divots have been etched in the quartz in regions that should have remained full thickness. The two types of defects can be in isolated regions or they can be adjacent or attached to a wanted region of full thickness quartz or to a region protected by chromium.

A solution is needed that provides for rapidly, accurately, reproducibly and reliably repairing defects in the quartz of phase shift masks, and this solution is provided by the following invention.

SUMMARY OF THE INVENTION

It is therefore an object of the present invention to provide a method of repairing both column and divot quartz defects in phase shift masks.

It is a futher object of the present invention to provide a method of repairing quartz defects in phase shift masks with a process having two partial removal steps so as to virtually eliminate printable defects and avoid further damage to the mask.

It is a feature of the present invention that an unwanted quartz region is removed by first removing part of the defect region in a focused ion beam tool, while leaving a thin wall of the quartz defect in place, and second by isotropically etching to remove the thin wall.

It is a feature of the present invention that an unwanted quartz region attached to a chrome line is removed by shining an ion beam at the defect at an angle so as to remove the attached quartz defect while avoiding damage to adjacent clear regions, the damage largely limited to regions under the adjacent chrome.

It is an advantage of the present invention that the defect repair process avoids damaging adjacent areas of the mask.

These and other objects, features, and advantages of the invention are accomplished by a method of repairing a mask comprising the steps of: (a) providing a substrate; (b) shining a beam on a portion of the substrate to remove a portion of the substrate and to leave a portion of the substrate comprising a thin wall; and (c) providing a second removal step to substantially remove the thin wall, wherein the second removal step comprises a process different from the shining step (b).

In another aspect, the invention is a method of repairing a mask comprising the steps of: (a) providing a mask substrate having a defect, the substrate having a substantially planar surface, there being a normal to the planar surface; and (b) shining a beam on the defect, the beam aimed at an angle greater than 10 degrees to the normal.

In another aspect, the invention is a method of repairing an alternating phase shift mask comprising the steps of: (a) providing a mask substrate having a surface, the surface comprising a first transparent region and a second transparent region, there being an optical thickness difference to provide a phase shift there between; and (b) shining a beam on the first region and on the second region to remove a portion of the substrate in the first region and in the second region, the portions of the substrate remaining retaining the optical thickness difference and the phase shift there between when the removing step is complete.

BRIEF DESCRIPTION OF THE DRAWINGS

The foregoing and other objects, features, and advantages of the invention will be apparent from the following detailed description of the invention, as illustrated in the accompanying drawings, in which:

FIG. 1a is a top view of a mask showing isolated defect 20a and attached defect 24a.

FIGS. 2b' and 2c' are a cross sectional views of an alternate process for providing the isotropic etch to remove a defect with a coating in place on other portions of the mask.

FIGS. 4a and 4b are cross sectional views of the use of an angled focused ion beam step to remove thin walls of cored defect with or without an isotropic etch step.

FIGS. 6b'–6c' are cross sectional views showing alternate steps to remove a divot defect from an alternating phase shift mask in which the region around the defect is FIB sputtered an odd multiple of 180°.

DETAILED DESCRIPTION OF THE INVENTION

Figure 1A:
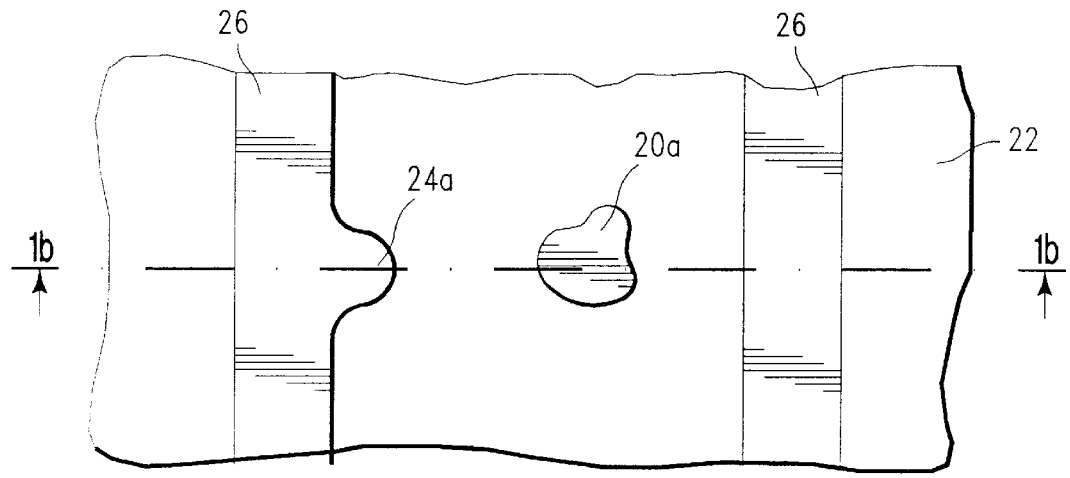

The present invention provides processes for repairing quartz defects of phase shift masks. While the '061 application, incorporated herein by reference, provides methods for making repairs in the chrome which ideally would prevent those defects from being realized as quartz defects, the applicant of the present invention recognized that, even with perfectly repaired chrome, further defects are likely in the quartz due to a mechanism such as foreign material falling on the mask before or during the chrome etch step that follows chrome repair. The various embodiments of the present invention are designed to repair quartz defects arising either because of a defect in the chrome or because of a later arising defect.

One embodiment of the present invention provides a method of repairing a defect in which an unwanted quartz bump or pillar-like structure is left on the mask. In this embodiment, a focused ion beam (FIB) is shined normal to the surface of the mask substrate on an inner portion of the pillar, leaving in place only an outer wall of the pillar. The ion beam cores out the pillar defect and does not cross over the edge of this outer wall of the pillar onto properly etched portions of the mask. Thus, damage to regions adjacent to the quartz pillar defect are avoided. The outer wall of the pillar which protected adjacent regions of the mask during the FIB coring step is then removed either by an isotropic etch in hydrofluoric acid or by sputtering the thin wall with a focused ion beam shined at an angle to the normal to the surface of the mask. The angle sputtering removes the outer wall of the pillar without damaging quartz in the region surrounding the defect and with only minimal damage in the center region of an isolated defect. The angle sputtering is particularly appropriate for attached defects, since for a sufficiently low angle, much or all of the sputtering damage is shadowed by chrome of the adjacent chrome line. Thus, most FIB damage to quartz in the transparent region adjacent to a defect is avoided. After the angle FIB an isotropic etch is used to smooth any residual defect. As described herein below, the isotropic etch can be accomplished exclusively in the defect area or it can be accomplished during a step to recess the quartz from overlying chrome for the entire mask.

In the case of an attached defect, the coring FIB step described above may be omitted. The entire repair may be accomplished with the angled FIB step in which any sputtering that extends beyond the defect may cause quartz damage primarily beneath the adjacent chrome line, where it does not significantly affect the functionality of the mask.

Another embodiment of the invention provides a method of repairing a defect caused by a region of wanted quartz being etched from the mask leaving a pit or divot where quartz should have been. In this embodiment, a focused ion beam (FIB) is shined normal to the surface of the mask substrate on the thick wanted quartz surrounding the divot quartz defect, and the entire region of wanted quartz surrounding the divot is sputtered away to a depth about equal to the depth of the divot or deeper, leaving in place a thin wall of the quartz around the divot defect. This thin wall is then removed either by an isotropic etch in hydrofluoric acid, or by sputtering the thin wall with an ion beam shined at an angle to the normal to the surface of the mask. The angle sputtering removes the wall without damaging quartz surrounding the wall and with only minimal futher damage in the center region of the defect. In this embodiment, simultaneous with the etch of the region surrounding the divot, the neighboring alternating region is also etched to maintain the 180° phase difference there between.

In this application, prepositions, such as "on," "over," "under" and "normal" are defined with respect to a mask substrate surface, regardless of the orientation the mask is actually held. A layer is on another layer even if there are intervening layers.

Figure 1B:
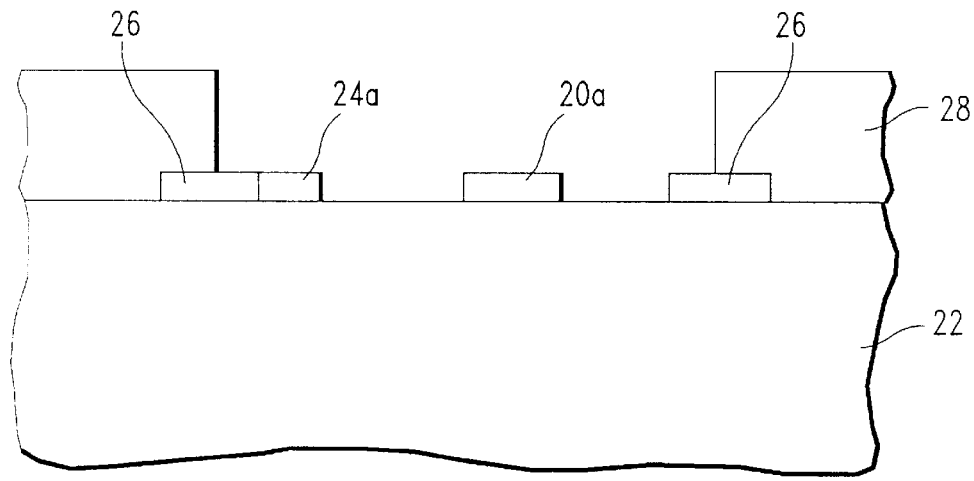
FIG. 1b–1e are cross sectional views of steps to produce quartz defects in a directional etch step and the effect of an isotropic etch step on defects of different size.
Figure 1C:
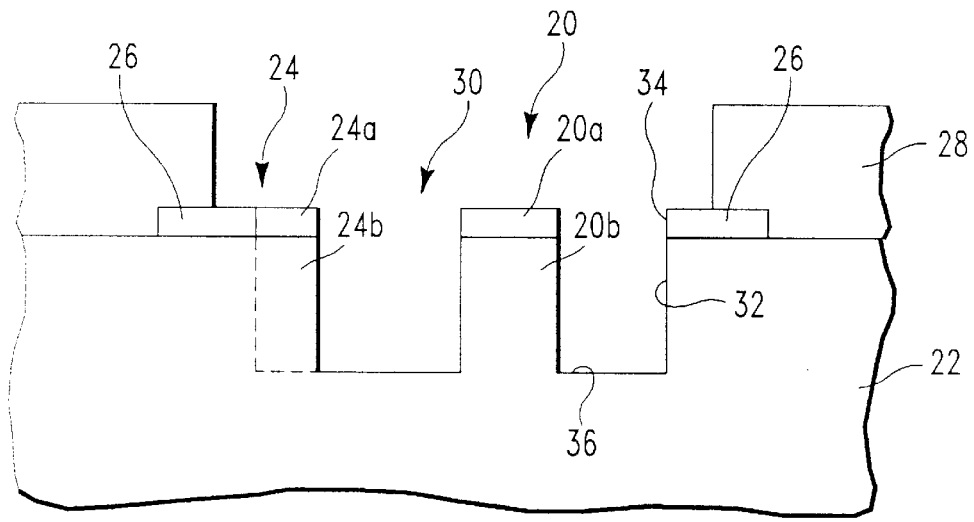
Figure 1D:
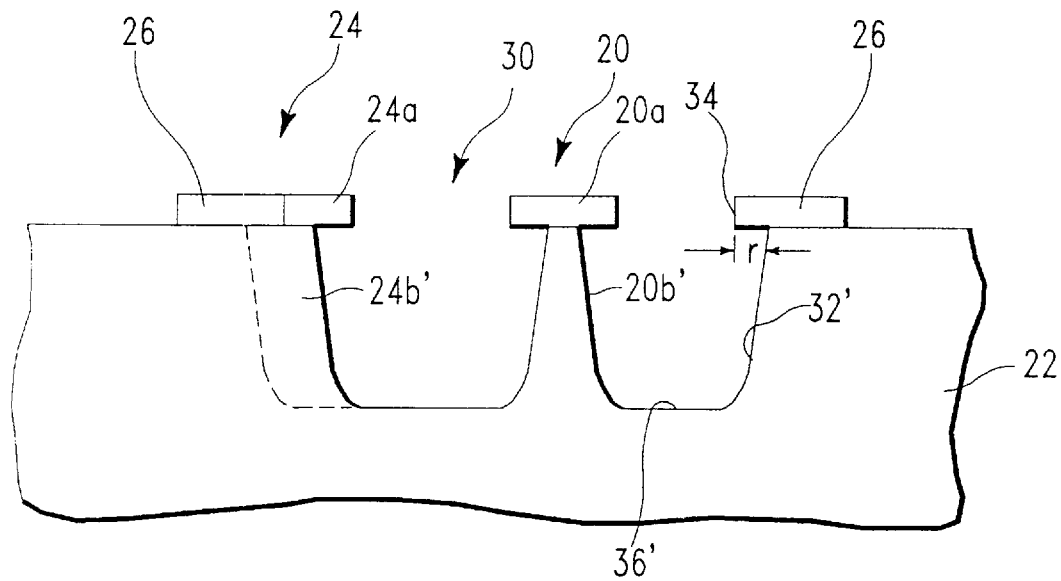

FIGS. 1a and 1b illustrate top and cross sectional views of isolated chrome defect 20a on quartz substrate 22. Also shown is attached chrome defect 24a adjacent chrome line 26. FIGS. 1b to 1d illustrate the steps in which unwanted chrome defects 20a, 24a produce quartz defects 20, 24. Unwanted chrome 20a, 24a causes pillars 20b, 24b to be left in quartz substrate 22 after the quartz etch step, which is shown in FIG. 1c. A directional etch is used in this process with blocking photoresist layer 28 in place in alternate regions of the mask to form trench 30 in quartz substrate 22 having sidewalls 32 and bottom surface 36. In the etching process, quartz sidewalls 32 are defined by edges 34 of chrome 26.

Figure 1E:
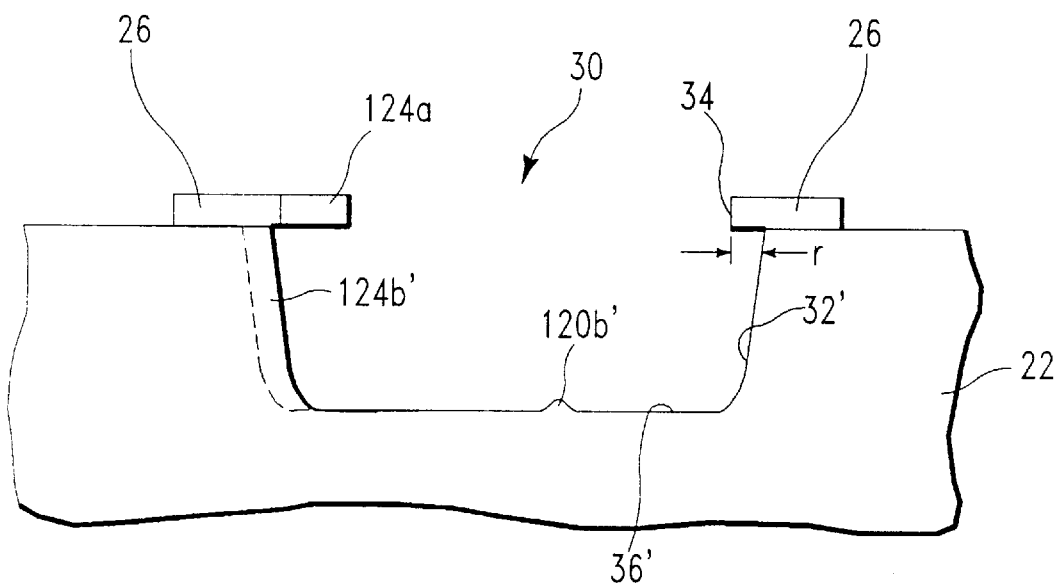

In the next step an isotropic etch, such as hydrofluoric acid, is used to recess quartz sidewalls 32 of trench 30 beyond edge 34 of chrome 26 by an amount r, forming recessed sidewalls 32' and further etched bottom surface 36'. This isotropic etch also thins quartz column 20b' and attached quartz defect 24b', as shown in FIG. 1d. If attached quartz defect 24b has a width less than r, and if defect 20b has a diameter less than twice r, the isotropic etch step would etch both these defects sufficiently to etch them completely away, as shown in FIG. 1e. Thus, the isotropic etch step automatically eliminates small defects in the quartz, leaving only small residual bump 120b' or sidewall region 124b' that is not recessed as much as other regions. While the presence of residual bump 120b' is an imperfection in the horizontal surface of isotropically etched surface 36', modelling results show that imperfections that have a height less than 30% of the height of a full column do not print.

While small isolated chrome defect 20a that is located on small isolated quartz defect 20b is eliminated when quartz defect 20b is etched away, the same process does not eliminate attached chrome defect 24a. If attached chrome defects are to be removed, they should normally be removed before the isotropic etch step (however, an embodiment of the present invention, described with respect to FIGS. 5a–5c, permits removal of attached chrome defects after the isotropic etch step).

Figure 2A:
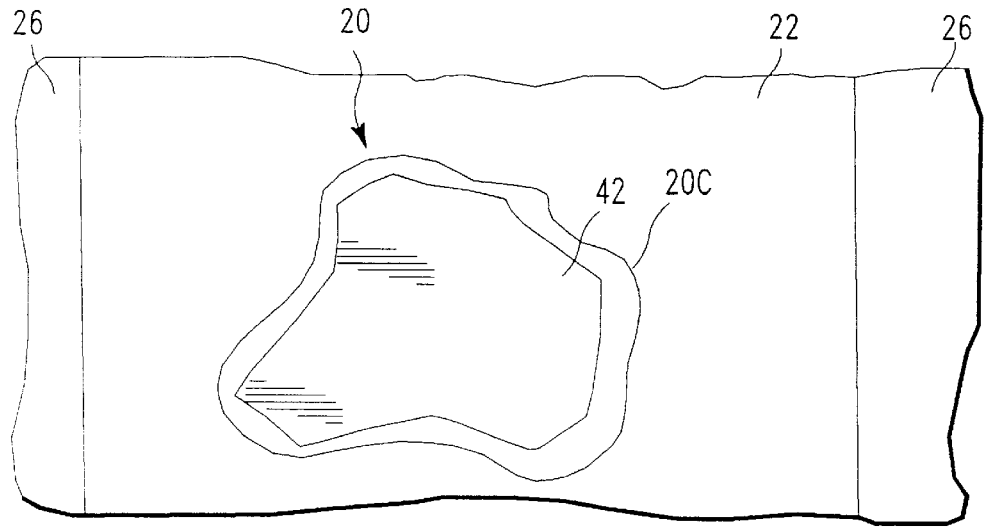
FIGS. 2a and 2b are top and cross sectional views of a mask showing isolated defect 20 after a first repair step, FIB removal of center polygon 42 leaving thin wall 20c.
Figure 2B:
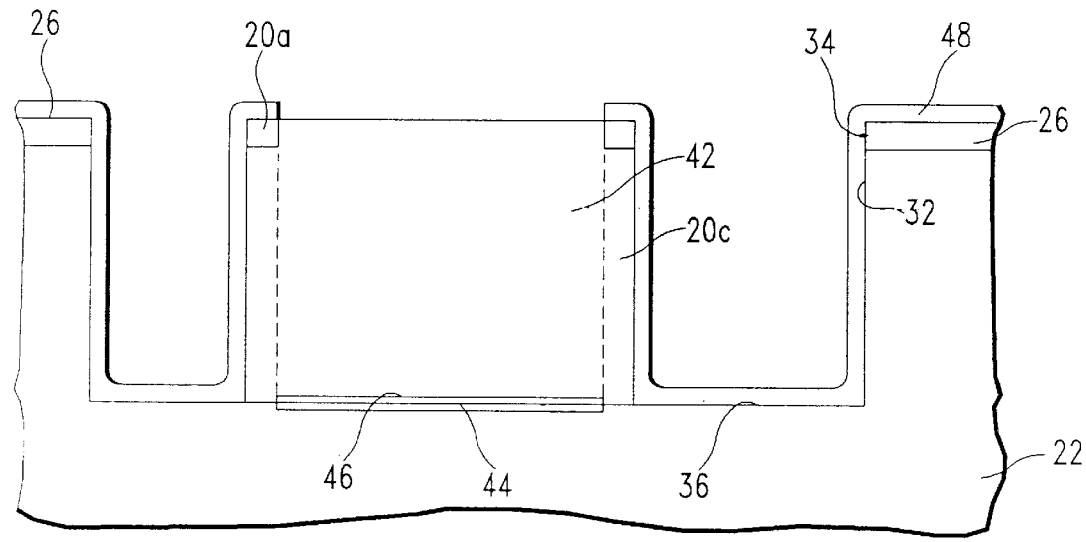
Figure 2C:
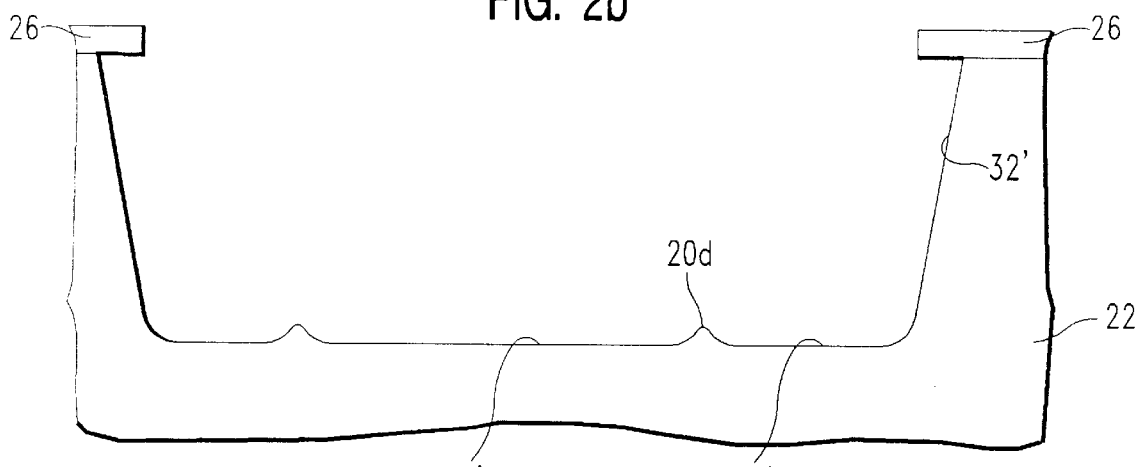
FIG. 2c is a cross sectional view of negligible remaining defect 20d after the structure of FIGS. 2a, 2b is subjected to an isotropic etch step.
Figure 2B:
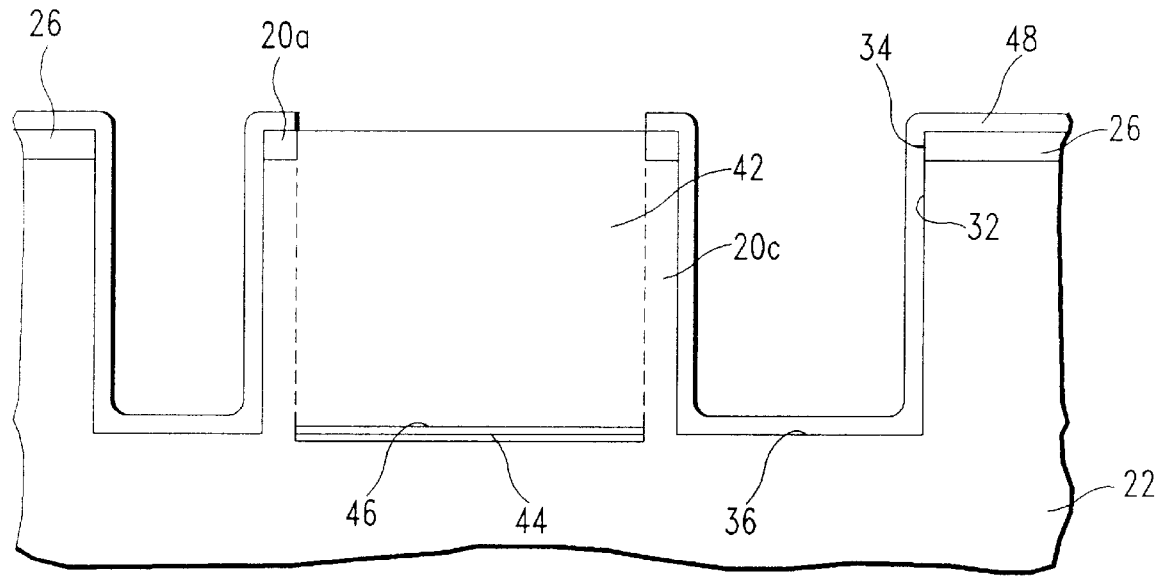
Figure 2C:
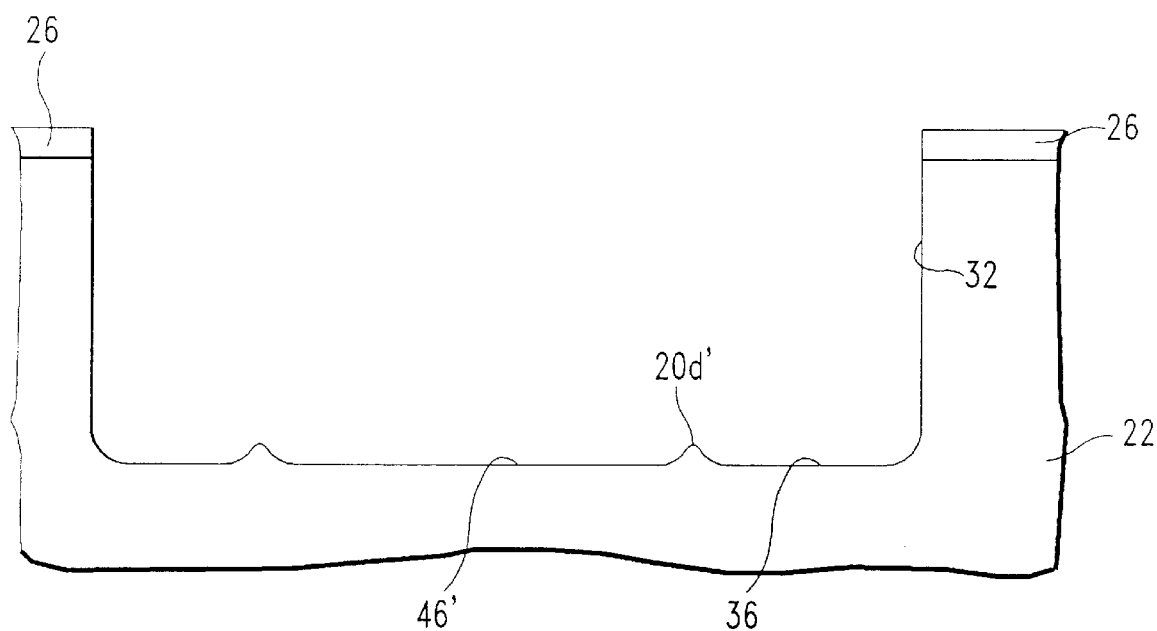

The present inventor discovered a method by which larger defects could also be removed with minimal residual damage in the isotropic etch step. In the present invention, as a preliminary step, FIB is used to core out center polygon 42 of original large defect 20, as shown in FIGS. 2a and 2b. This FIB sputtering step leaves thin wall 20c of quartz along the periphery of quartz defect 20b and gallium stain region 44 in bottom surface 46 of defect 20b. Thus, potential gallium staining or sputtering of adjacent clear regions of substrate 22 is avoided. The FIB coring step must remove enough of the center of defect 20b so that the subsequent isotropic etch, etching from both sides of thin wall 20c, completely removes thin wall defect 20c leaving only small residual bump 20d' as shown in FIG. 2c. This subsequent isotropic etch also completely removes gallium stained region 44. While FIGS. 2a–2c show the repair of an isolated defect, the same coring process can be used to repair large attached defects, such as defect 24 of FIGS. 1a–1d.

The present invention is best practised by providing thin conductive coating 48 (FIG. 2b) on at least the region of the mask to be repaired to prevent charging by the ion beam and consequent beam drift, as described in the '061 patent application. Coating 48 is deposited before the FIB repair step and is formed of a metal such as copper, gold, aluminum, or chromium. After the FIB processing is complete coating 48 is removed. For simplicity of illustration, coating 48 is not shown in most figures of other embodiments of this invention.

However, as shown in FIGS. 2b', 2c', coating 48 permits the use of the isotropic etch to attack quartz exclusively within center polygon 42 to remove thin walls 20c leaving only small bump 20d' and gallium stain 44 while further recessing bottom surface 46' provide surface substantially coplanar with surface 36. Coating 48 protects other areas of the mask, such as sidewalls 32, bottom surface 36, and chrome 26 from the isotropic etchant. Thus, recessing of sidewalls 32 beyond chrome edges 34 is avoided (FIG. 2c'), as required for rim shift masks. In addition, the light absorbing layer of chrome oxide usually provided on chrome 26 is protected during the isotropic etch portion of the defect repair. Coating 48 is removed after the isotropic etch step to provide the repaired mask shown in FIG. 2c'. Of course it is also possible to provide the repair in a first isotropic etch step with coating 48 in place as shown in FIGS. 2b', then to remove coating 48 as shown in FIG. 2c', and then to provide the recess of FIG. 2c in a second isotropic etch step. While not specifically shown for each embodiment, coating 48 can be used for masking during an isotropic etching step in each of the embodiments of the invention described herein below. In each case the FIB processing opens coating 48 exclusively in the defect region.

Figure 3A:
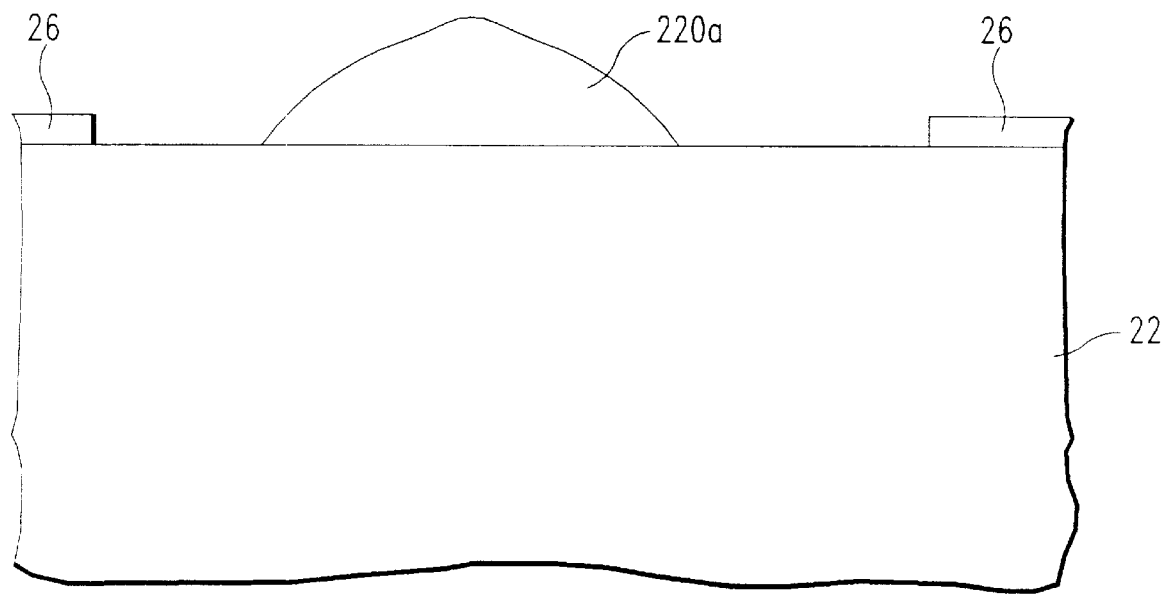
FIGS. 3a and 3b are cross sectional views of a mask showing steps in which a piece of foreign material on the mask during a directional etch step cause non planar isolated quartz defect 120.
Figure 3B:
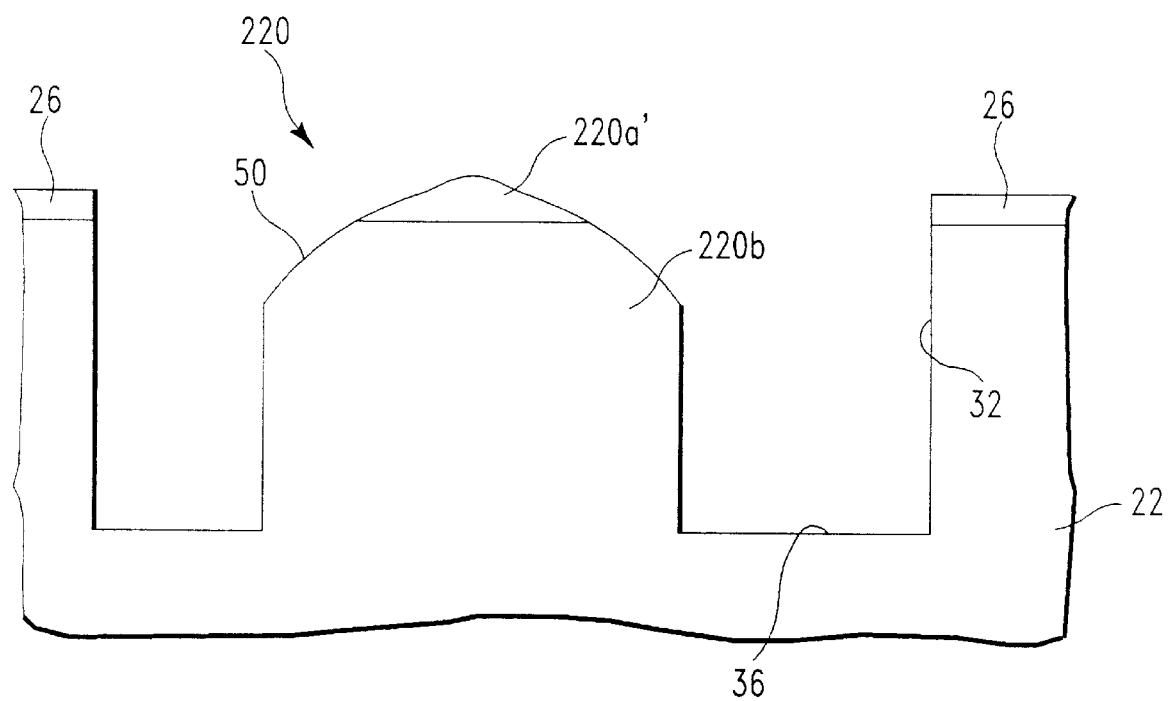

Of course, entire center polygon 42 need not be totally removed in the FIB step shown in FIGS. 2a, 2b. A series of thin walls can be left within this polygon, all the thin walls to be simultaneously removed in the subsequent isotropic etch step. The thin walls can be configured, for example, as concentric polygons within center polygon 42 or as parallel lines within core polygon 42 to provide a grating. Thus, the time for the FIB coring step can be substantially reduced by more fully taking advantage of the subsequent isotropic etch step. This idea is illustrated in FIGS. 3i–3k and more fully described herein below for defects having sloping sidewalls.

If the defect is due to unwanted chrome 20a (FIG. 1b) being left on the mask then the top surface of the defect under chrome layer 20a will be planar as shown in FIGS 1b–1c. However, if, as shown in FIG. 3a, the defect is caused by foreign material 220a that falls on the surface of mask substrate 22 after the chrome etch step of FIGS. 1a, 1b, but before the directional etch of step 1c, the directional etch could leave an irregular top surface 50 of quartz defect 220b, as shown in FIG. 3b. Here, the particle of foreign material 220a is etched in the directional etch step of FIG. 3b, and variation in thickness of foreign material 220a is transferred into quartz substrate 22 to provide irregular top surface 50 when that etch step is complete.

Figure 3C:
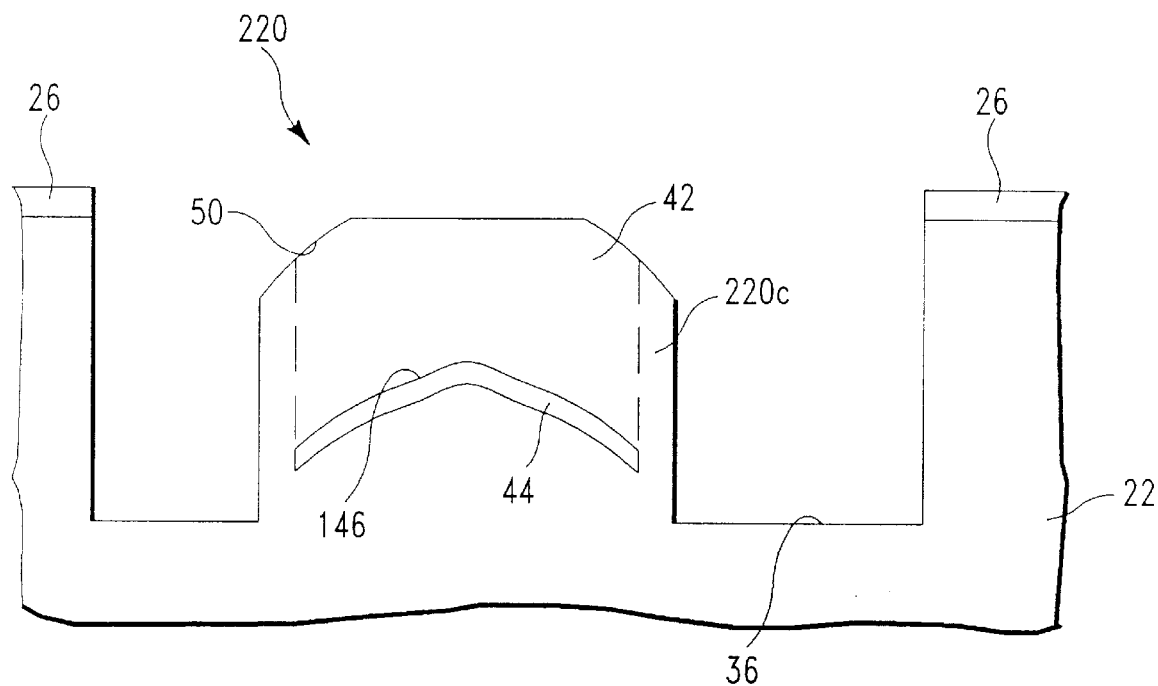
FIGS. 3c and 3d are cross sectional views showing steps for repair of the non planar defect of FIG. 3b including a first FIB coring step and a second isotropic etch step.

In the next coring step, this irregular top surface 50 of defect 120b is transferred into bottom surface 146 of defect 220, as shown in FIG. 3c. Any non-planarity in quartz defect 20b will thus be reproduced in bottom surface 146 after the coring step shown in FIG. 3c. While the isotropic etch step of FIG. 3d smooths irregularities, much of the non-planarity will remain in bottom surface 36', 146' after the isotropic etch.

Figure 3D:
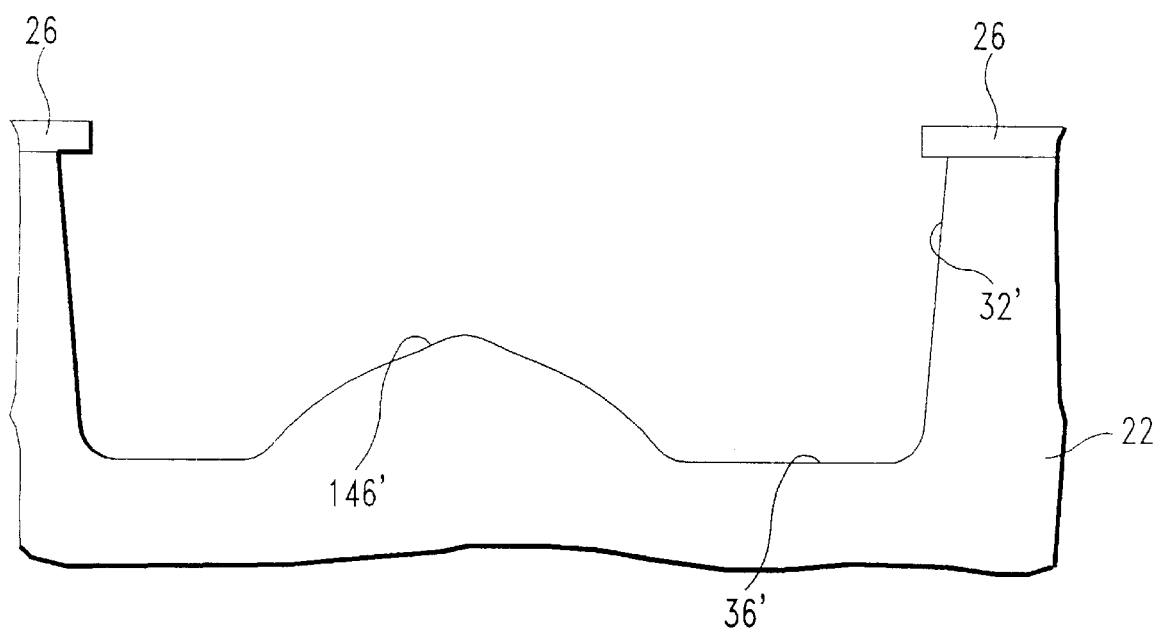

However, modelling of the aerial image produced by phase shift masks with non-planar bottom surfaces, such as that illustrated in FIG. 3d, shows that a non-planarity in bottom surface 36', 146' that contribute less than about ⅓ of the phase difference does not significantly affect the printing of the mask on the wafer. Thus, the present invention takes advantage of the facts that (1) chrome defects provide an inherently planar quartz surface, and (2) it is not necessary to planarize most foreign material defects to maintain sufficient planarity to avoid printable defects.

Thus, the present inventor recognized that a planarizing layer is not needed for repair of alternating phase shift masks. Previous attempts to planarize by deposition of a planarizing layer in a FIB tool for example, suffer from the fact that the deposition of a planarizing layer deposits material not just in the desired location, but also in a broad halo extending from the desired location. The present inventor found this distance to be on the order of microns. This halo causes absorption of light and its prevention or removal is difficult, as described in the '061 application. The present invention also has advantage in that further processing steps, such as laser ablation, to remove remaining portions of the defect and the planarizing layer are not needed in the present invention. As described in the '061 patent application, a laser ablation step is likely to damage the underlying quartz. In the present invention, a wet etch is used to fully remove remaining portions of the defect without causing additional damage to the mask. Thus, the present invention has significant advantage over using a planarizing layer by avoiding cost, complexity, and additional defects to the mask.

The present inventor further recognized that any gallium stain left by the FIB sputtering in bottom surface 146 of core polygon 42 would be removed by the isotropic etch step as well. Thus, virtually all traces of both large and small quartz column defects and the gallium stain are all removed from the mask in the isotropic etch step.

In previous attempts at FIB repair, the FIB was used to remove the entire defect while attempting to minimally overlap adjacent regions of the mask. To the extent the FIB sputtering extended beyond the edge of the defect, grooves were formed in the substrate beyond this edge, and thus additional defects were formed surrounding the original defect while attempting to make a repair. To remove a defect having any shape while minimizing this damage to the surrounding region, the present inventor takes advantage of the ability to program a FIB tool to sputter a designated polygon that approximates the shape of the defect. The inventor found that removal of the entire defect in the FIB tool was not needed and recognized that a two step removal process as described herein above, would significantly improve results. In the first step, the FIB tool is used to core out a center portion of the defect. The coring can remove the entire center portion or just remove lines through the defect to leave thin walls of the defect. In the second step, a process, such as a wet etch, is used to remove these thin walls. Further, the present inventor found that by containing the FIB sputtering polygon completely within the defect area, not only is sufficient removal achieved in the wet etch step, but adjacent regions are protected from FIB sputtering damage and gallium stain defects.

Furthermore, the present invention also provides methods of reducing the magnitude of nonplanarity in bottom surface 146 (FIG. 3c) caused, for example by foreign material having thickness variation, without the need for the planarizing layer of the prior art.

Figure 3E:
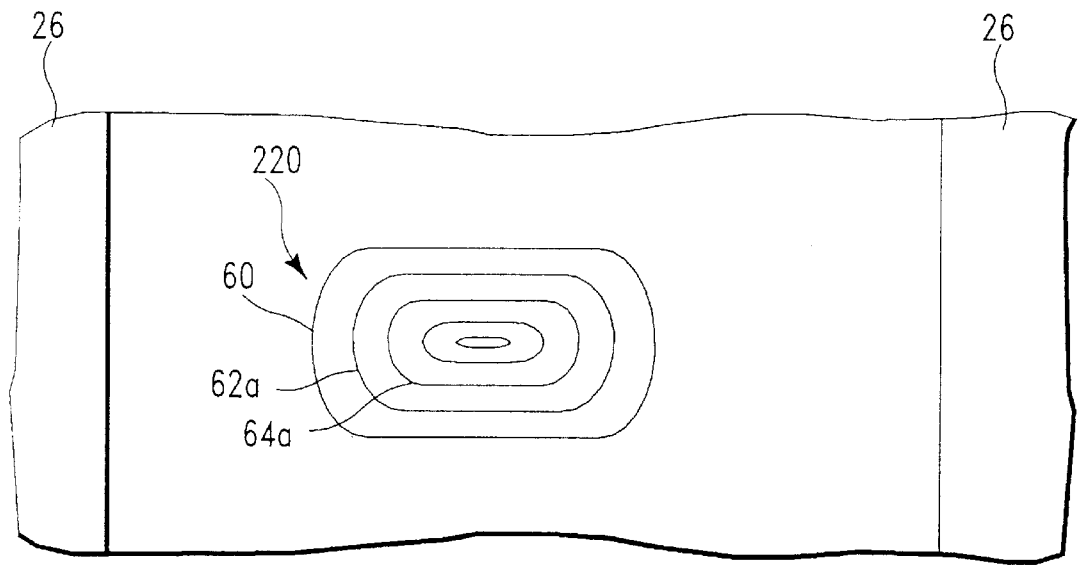
FIGS. 3e to 3h are cross sectional views showing alternate steps for repair of the non planar defect of FIG. 3b including a first FIB coring step, then a sequence of FIB planarization steps within the cored region of the defect, and finally an isotropic etch step.
Figure 3F:
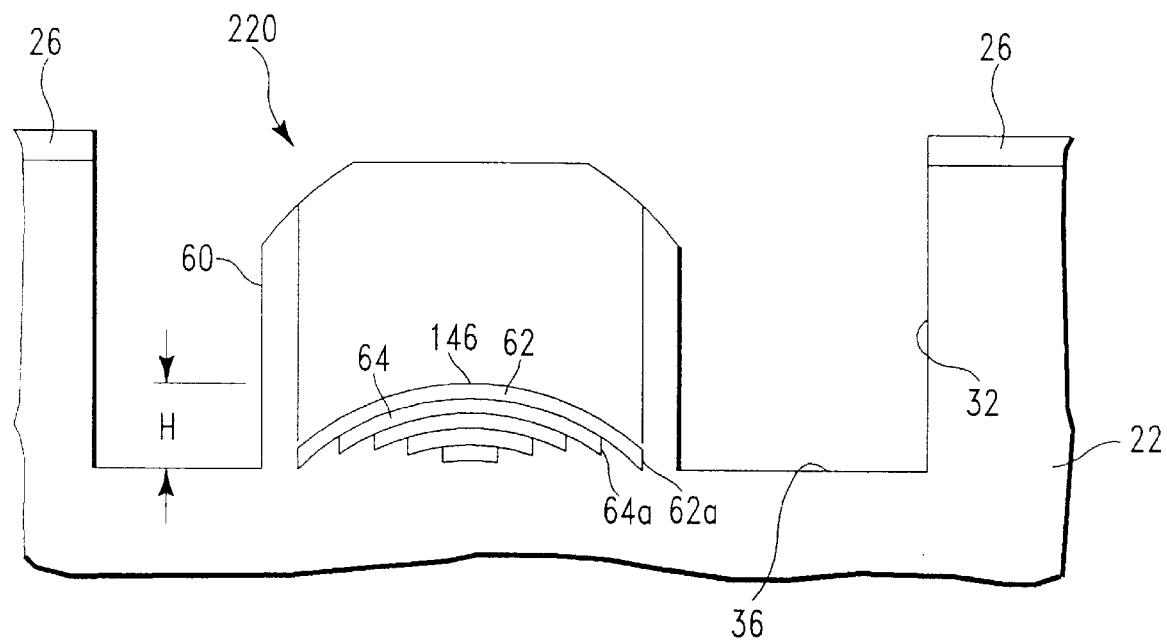
Figure 3G:
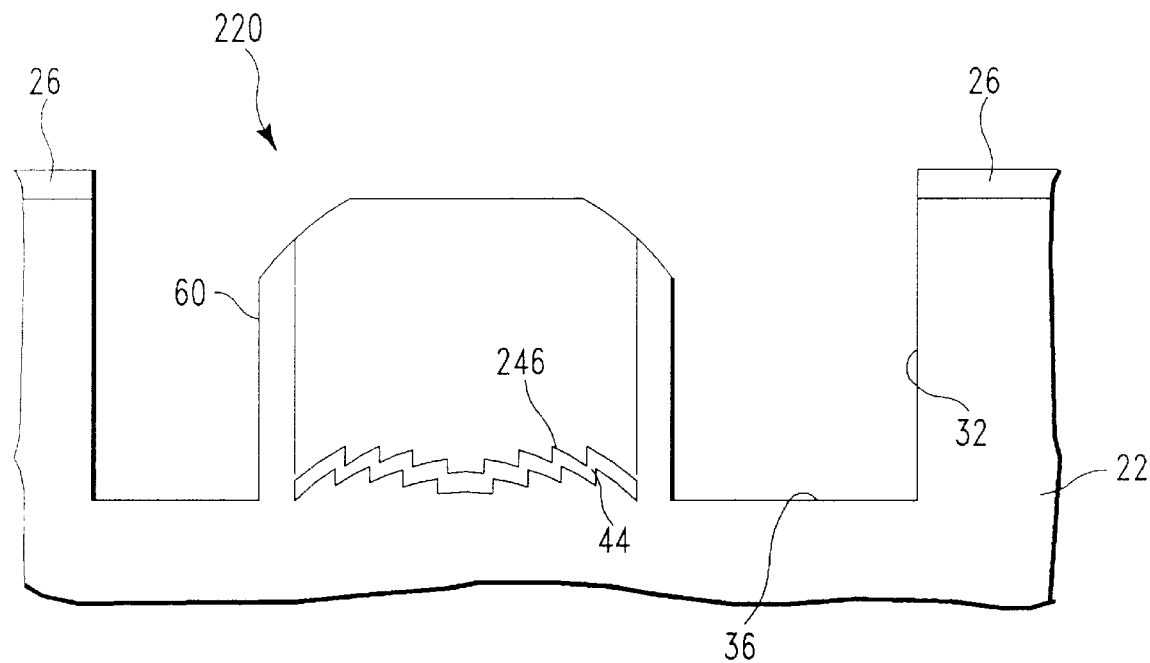
Figure 3H:
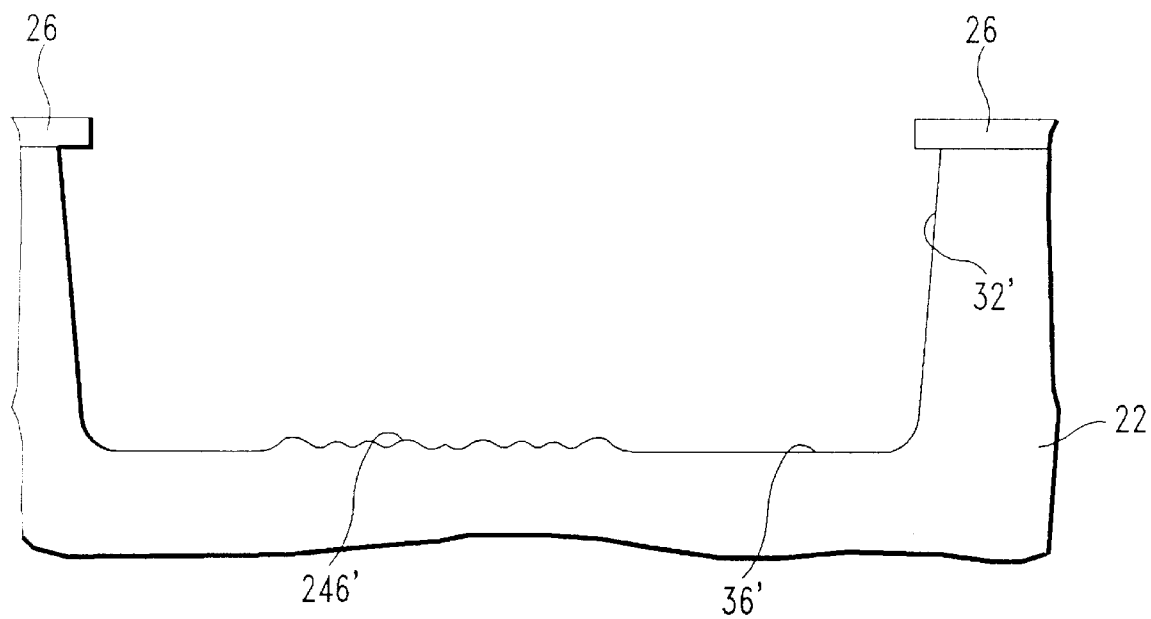
Figure 3I:
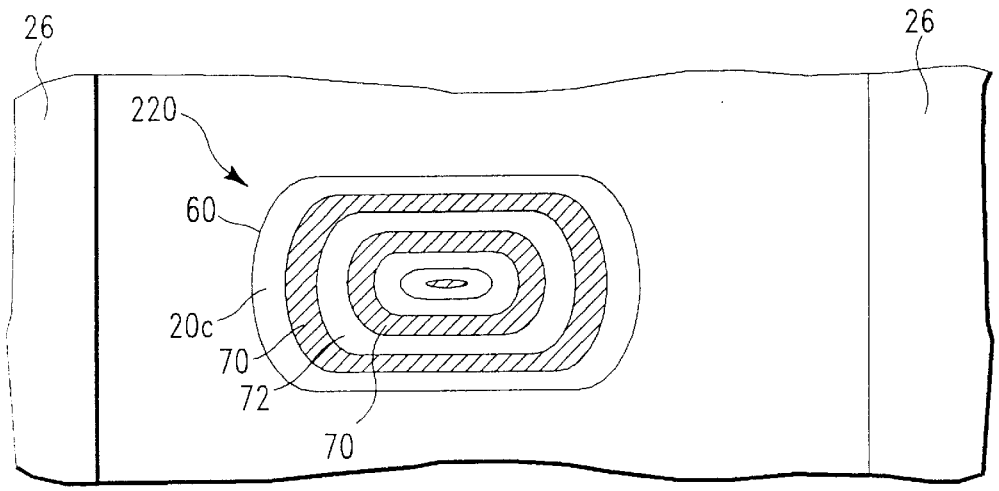
FIGS. 3i to 3k are cross sectional views showing another set of alternate steps for repair of the non planar defect of FIG. 3b including forming a plurality of trenches within the defect to provide thin walls and then an isotropic etch step to remove the thin walls.
Figure 3J:
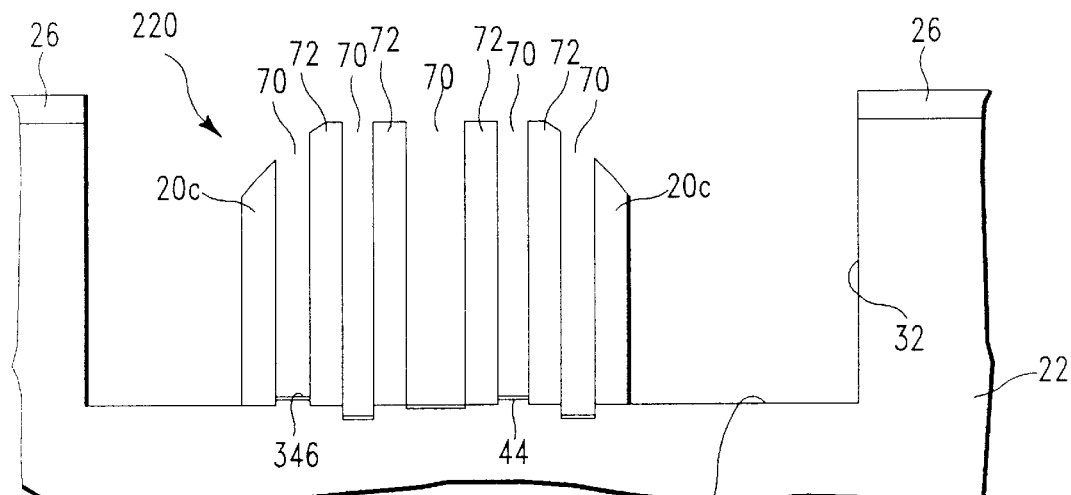
Figure 3K:
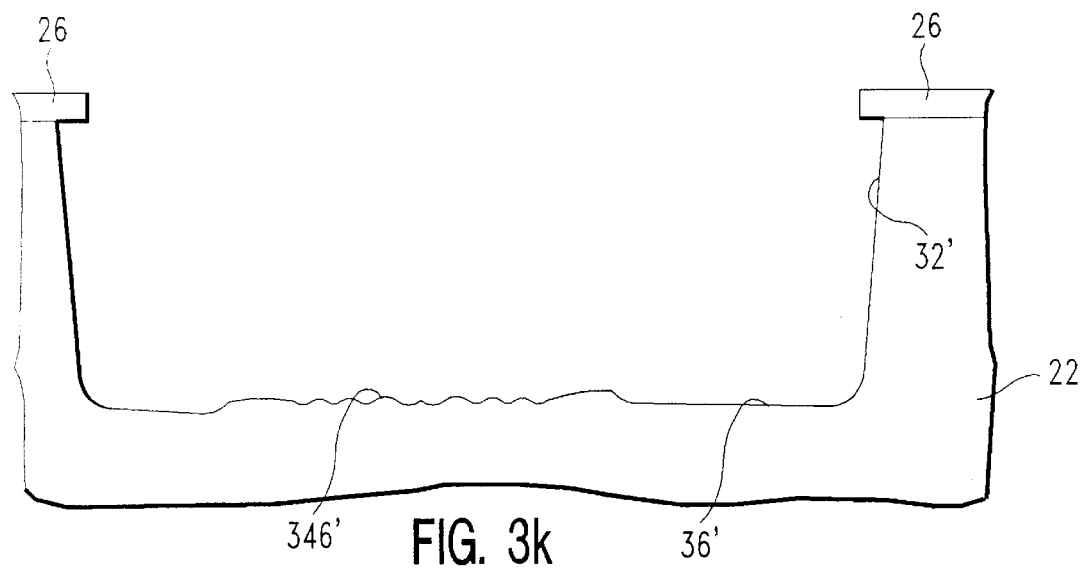

In a first of the methods for reducing nonplanarity, a focused ion beam is shined on surface 146 entirely within perimeter edge 60 of defect 220 to sputter layer 62 from surface 146 starting from edge 62a that is entirely within defect 220 as shown in FIGS. 3e, 3f. Thus, thin portions of defect 220 extending beyond edge 62a of layer 62 are not struck by the focused ion beam and FIB damage outside the defect is avoided. In the next step, the offset is again applied, now within edge 62a of defect 220 to define edge 64a. Layer 64 is FIB sputtered from the remaining surface of defect 220. These steps of offsetting and FIB sputtering are repeated, each time sputtering a smaller area within defect 220, until height H of defect 220 has been sufficiently reduced as shown in FIG. 3G. The isotropic etch described above is then performed, as shown in FIG. 3h, recessing edge 32' from chrome edge 34, rounding and smoothing any sharp edges in surface 246', and removing quartz having gallium staining 44 to provide surface 36', 246' with improved transparency. As mentioned above, as long as any residual surface roughness is within about ⅓ of the phase difference between adjacent alternating phase shift regions, the defects will not print.

In the second of the methods for reducing nonplanarity, thin trenches, such as annular shaped rings 70, are sputtered within core 42, each annular ring 70 positioned approximately along a topographic contour line or line of constant elevation on defect 220, as shown in FIG. 3i, leaving thin walls 72 in addition to outer thin wall 20c. The depth of sputtering is adjusted for the height of each contour line to provide bottom level 346 of each sputtered trench 70 that is approximately coplanar with surface 36 outside defect 220. Thin walls 72 left between sputtered trenches 70 are sufficiently thin to be entirely removed in the isotropic etching step that will follow. Thus, after the isotropic etching step of FIG. 3k, surface 346' is sufficiently smooth and planar so that any remaining roughness does not print.

Figure 4A:
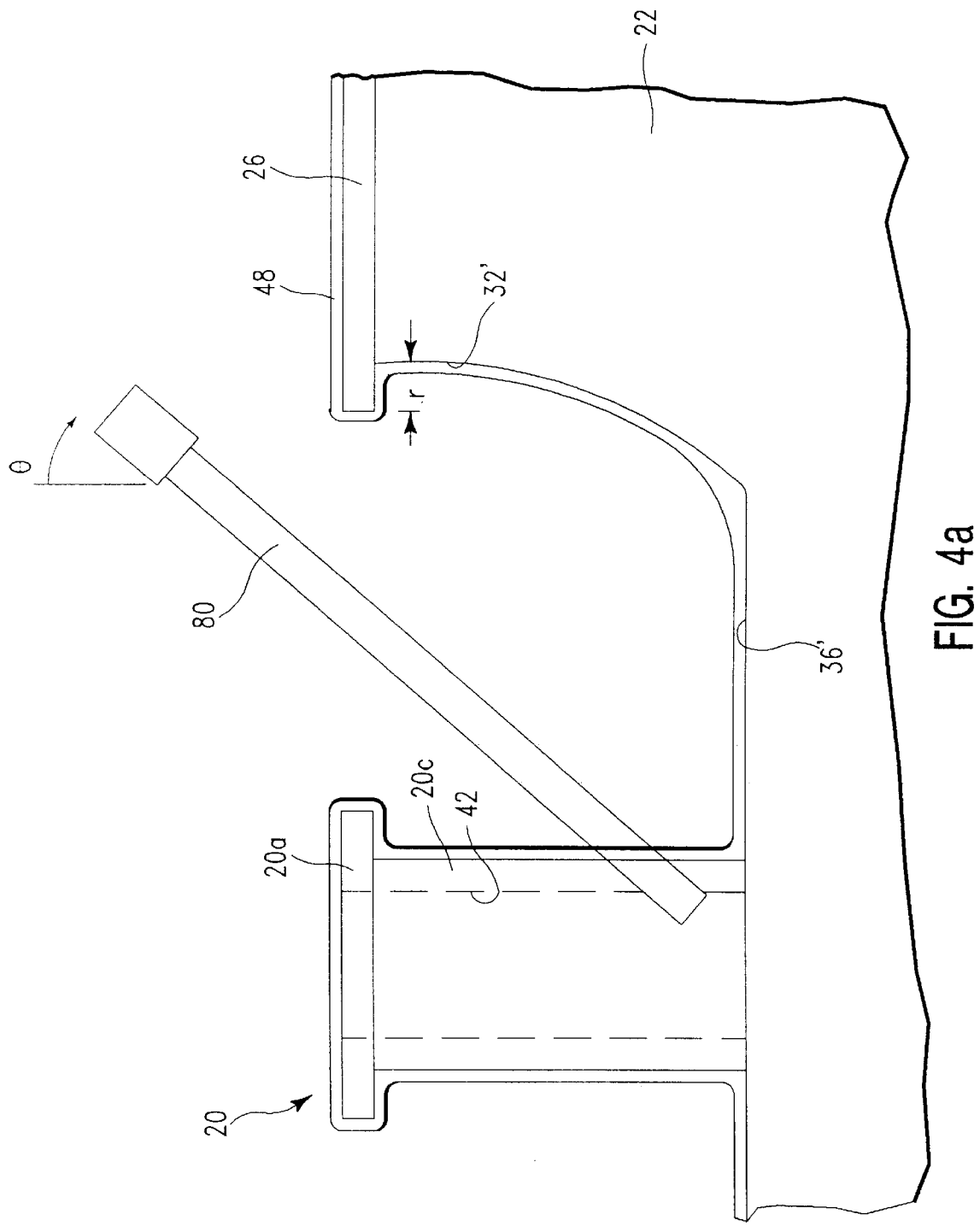

FIGS. 4a–4b show another embodiment of the invention in which an angled FIB sputtering step is implemented to remove thin sidewalls 20c of defect 20. Thus, a defect found even after the isotropic etch step is complete can be removed to provide an acceptable mask. FIB ions 80 are aimed at as low an angle θ as practical to sputter thin sidewalls 20c of defect 20. By adjusting the beam-wafer orientation, the beam is sequentially aimed from several directions to sputter the various sides of defect 20. Thus, nearly all portions of thin walls 20c are removed as shown in FIG. 4b, leaving only small residual defect 82 as shown in FIG. 4b. Quartz within residual defect 82 may have been pitted and gallium stained by the angled FIB sputtering to provide pitted surface 84 with gallium stain 44. However, if thin walls 22c are sufficiently thin, the time required for the angle FIB sputtering step is brief and the pitting 84 to bottom surface 36' and staining 44 within the defect are therefore negligible. Of course, if the angle FIB sputtering is used before the isotropic etch step, residual damage is further reduced or eliminated as described hereinabove. Furthermore, if coating 48 is used (as shown in FIG. 4b), an isotropic etch step can be implemented to smooth defect 82 and remove gallium stain 44 exclusively within the defect region while all other portions of the mask are protected by the coating. While coating 48 is usually deposited by sputtering, a chemical vapor deposition can also be used to provide coating 48 to protect all exposed surfaces.

Figure 5A:
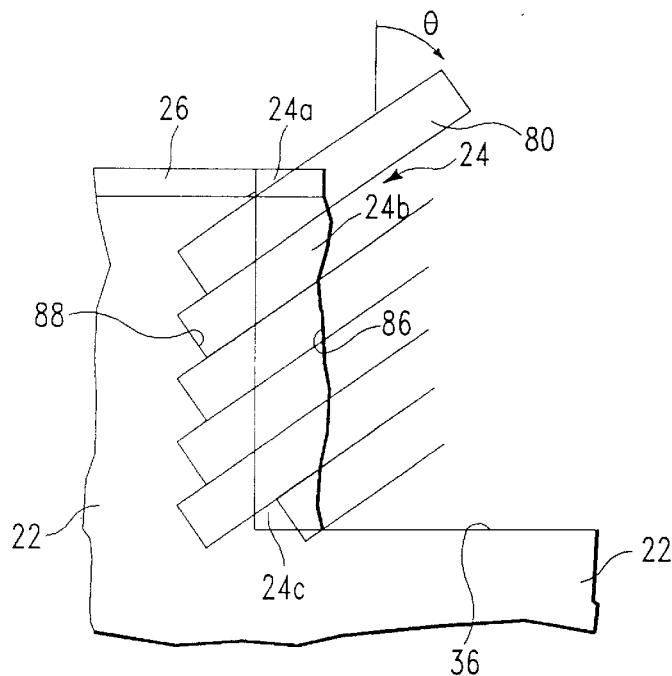
FIGS. 5a–5c are cross sectional views of an angled focused ion beam step and an isotropic etch step to remove an attached defect.
Figure 5B:
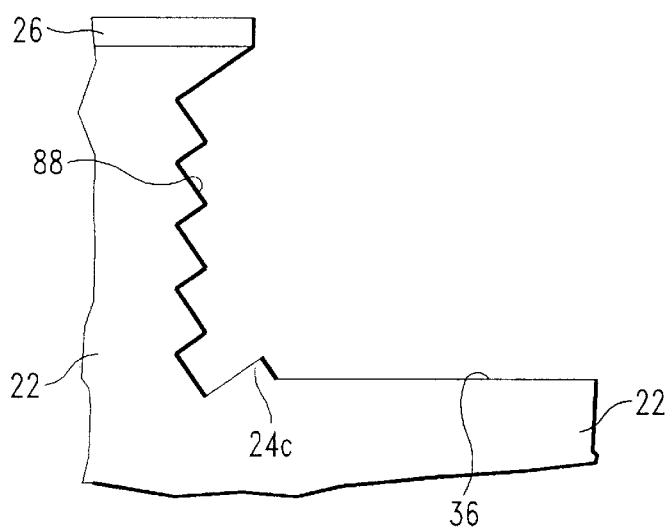
Figure 5C:
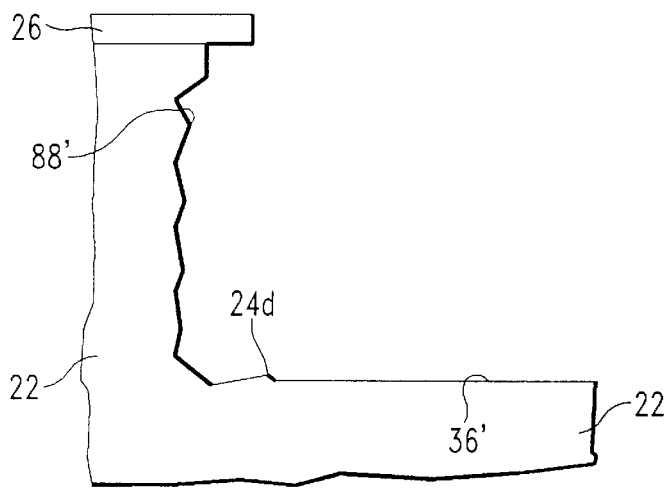

The angle FIB sputtering can be used in conjunction with or instead of a coring step to remove attached defect 24 that is adjacent to chrome line 26, as shown in FIG. 5a. FIB ions 60 are aimed at as large an angle θ as practical to sputter sidewall 86 of attached quartz defect 24b. Attached defect 24b is entirely removed either with sequential sputtering steps as shown in FIG. 5a, or in a single scanned sputtering along sidewall 86 of defect 24. As shown in FIG. 5a, the ion beam sputtering damages adjacent quartz substrate 22, leaving rough sidewall edge 88 adjacent and rough horizontal surface 24c under defect 24b. Rough edge 88 is primarily located under chrome line 26, and light passing through this region of quartz will be blocked by chrome 26; thus, damage to quartz substrate 22 under chrome line 26 does not print on wafers. Therefore the depth of the damage along sidewall 88 is not critical. However, the FIB sputtering also damages exposed quartz 24c not protected by chrome 26, as more clearly illustrated in FIG. 5b. However, this damage is smoothed in the isotopic etch step shown in FIG. 5c leaving only small residual defect 24d'. As mentioned herein above, modelling indicates that roughness does not print if it provides a phase shift of less than about 30%, and more preferably less than about 15%. Residual quartz damage 24c is minimized to the extent it is possible to increase angle θ. As shown in FIGS. 5a–5c, attached chrome defect 24a is removed in the angle FIB repair step itself, and therefore it need not first be removed. As described hereinabove, a coating used to prevent charging during the FIB sputtering step shown in FIG. 5a can be retained during the etching step of FIG. 5c to protect other regions of the mask from the isotropic etchant used to smooth FIB damage and prevent unwanted recess elsewhere.

Figure 6A:
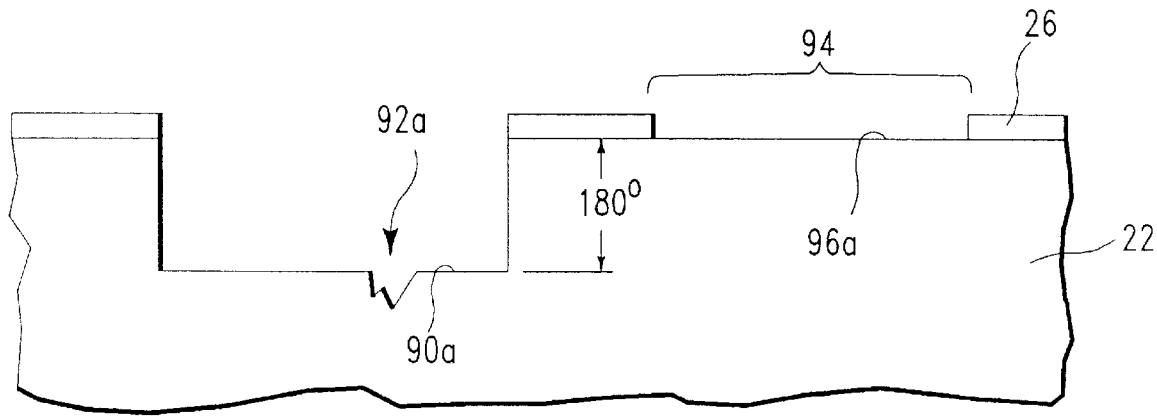
FIGS. 6a–6c are cross sectional views showing steps to remove a divot defect from an alternating phase shift mask taking advantage of the processes of the present invention.
Figure 6B:
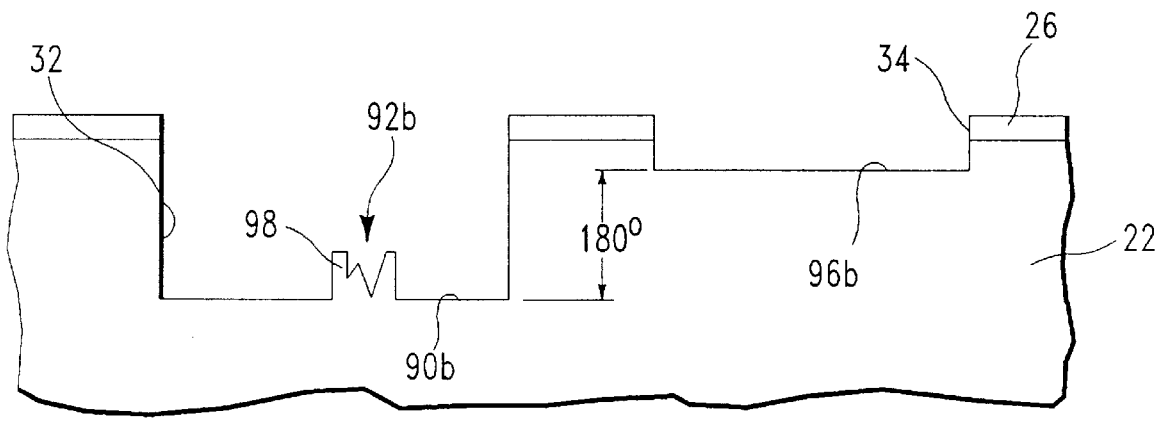
Figure 6C:
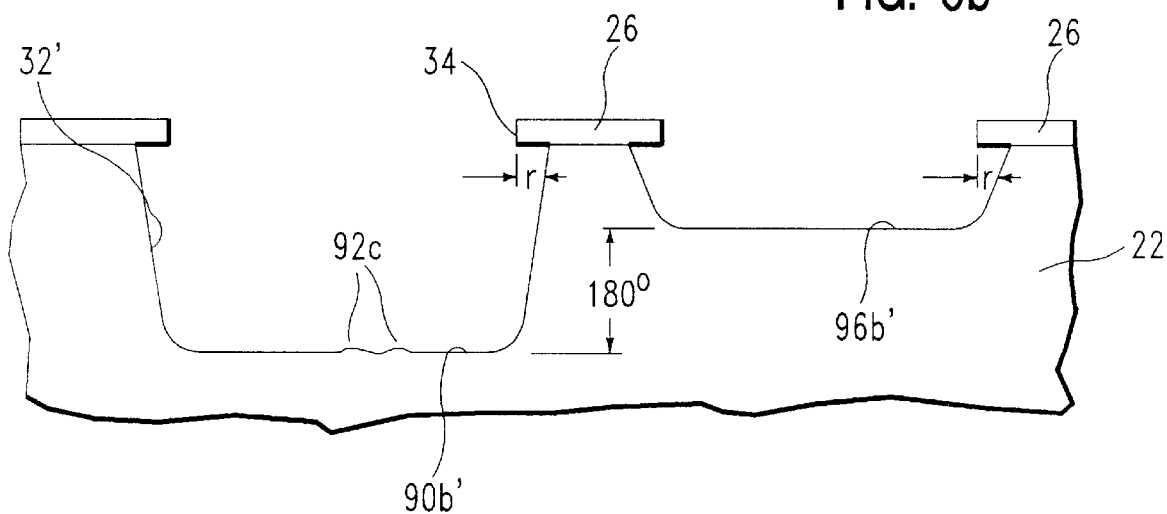
Figure 6B:
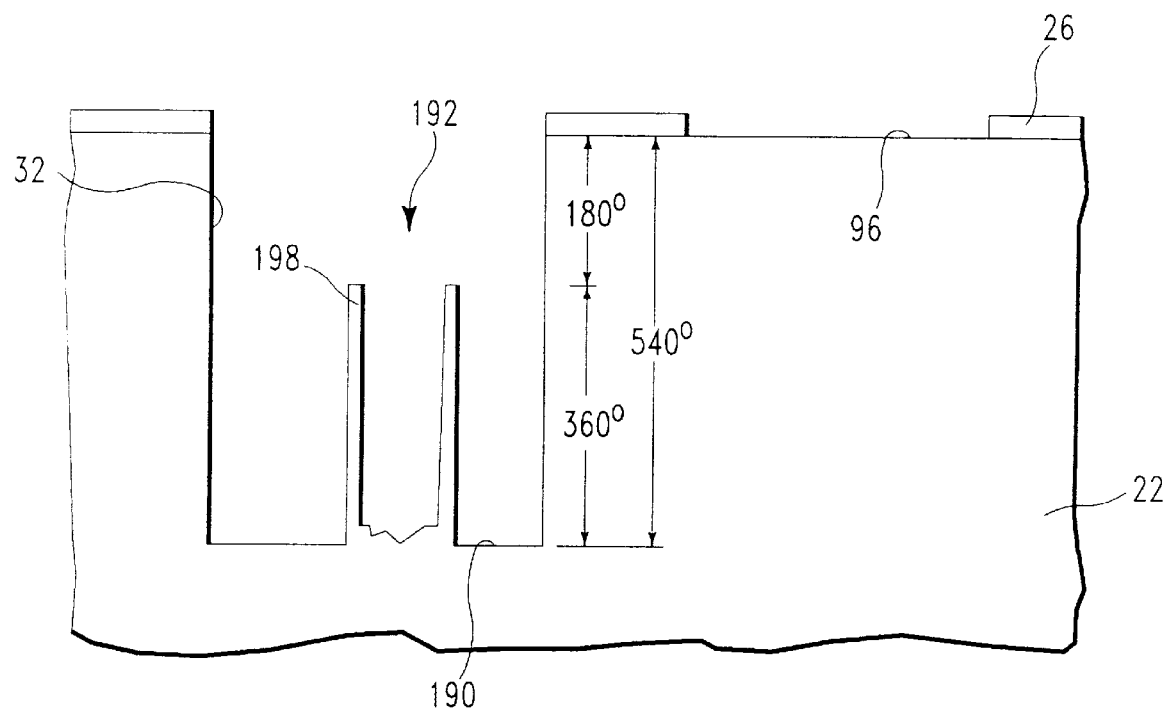
Figure 6C:
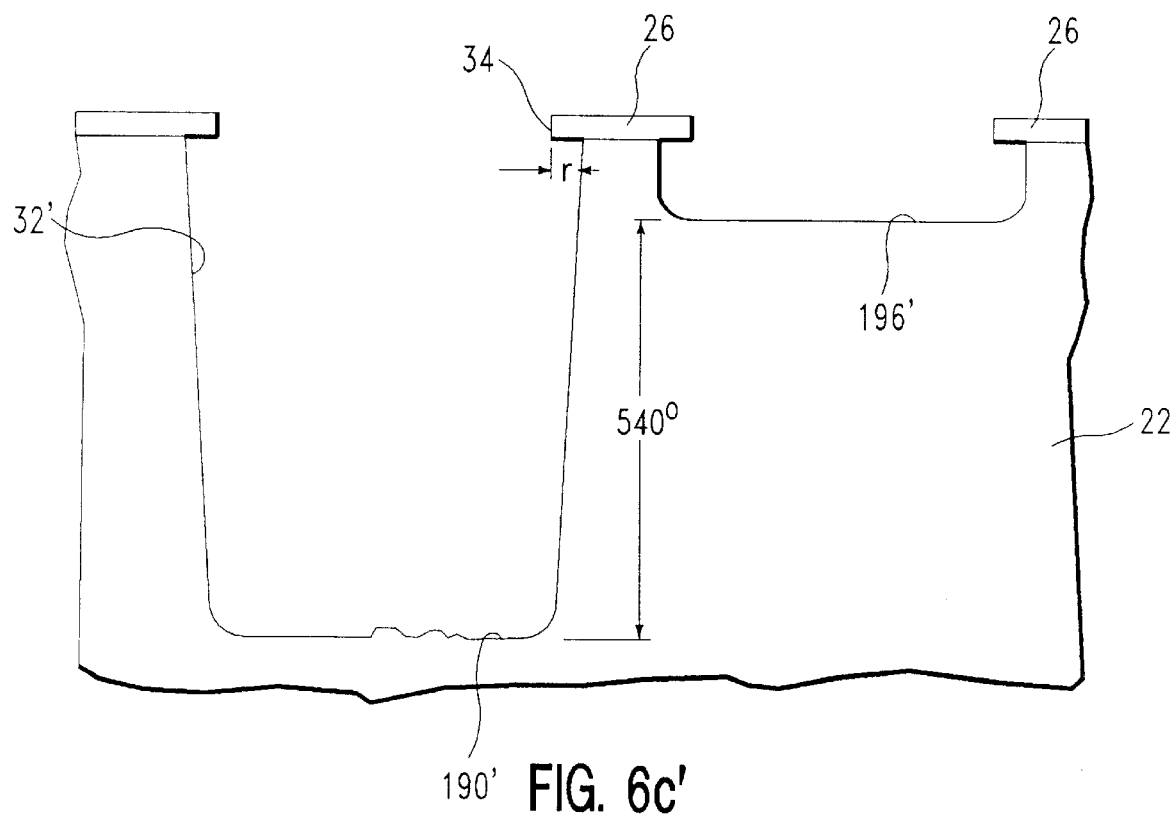

The present invention is applicable not just for bump defects but also for divot defects, such as divot defect 92a in surface 90a in alternating phase shift mask substrate 22 as shown in FIG. 6a. In essence, a divot defect is repaired by treating the region surrounding the divot as if it were a bump defect. Thus, quartz surface 90a in the region surrounding divot 92a is FIB sputtered to approximately the depth of divot 92a as shown in FIG. 6b. In addition, adjacent region 94 of substrate 22 having surface 96a that provides light having a 180° phase difference is simultaneously FIB sputtered. Thus, when the FIB sputtering step is complete, the phase difference between surface 90b and surface 96b remains 180° as shown in FIG. 6b. The FIB sputtering polygon selected for the region surrounding defect 92a is set to leave thin wall 98 of quartz surrounding divot 92b. The next step, shown in FIG. 6c, recesses quartz a distance from edge 34 of chrome line 26. This isotropic etch also completely removes thin wall 98 surrounding divot 92b, leaving residual defects 92c that are so small that they do not print on a wafer.

In another embodiment, surface 96 is not FIB sputtered but surface 190 surrounding divot 192 is FIB sputtered a distance to maintain an odd multiple of the desired 180° phase difference between sputtered surface 190 and unsputtered surface 96 as shown in FIG. 6b'. For example, as shown in FIG. 6b', surface 190 is sputtered so that the distance between surfaces 190 and 96 provides 540°, or three times the 180° phase difference. Also shown in FIG. 6b' is a subsequent coring step within defect 192 to thin walls 98 to less than about half of recess distance r that will be provided in the next step. In that next step, shown in FIG. 6c', thin walls 98 surrounding divot 192 are removed in an isotropic etch, leaving residual defects 92c in surface 190' that are so small that they do not print on a wafer. At the same time surface 96 is isotropically etched so that the desired odd multiple of 180° phase difference between surface 190' and surface 196' is maintained.

While several embodiments of the invention, together with modifications thereof, have been described in detail herein and illustrated in the accompanying drawings, it will be evident that various further modifications are possible without departing from the scope of the invention. For example, a coating can be provided in each embodiment to prevent recess of the quartz beyond the chrome during an isotropic etch in the defect region. Nothing in the above specification is intended to limit the invention more narrowly than the appended claims. The examples given are intended only to be illustrative rather than exclusive.

What is claimed is:

1. A method of repairing a mask comprising the steps of:
   (a) providing a substrate;
   (b) shining a beam on a portion of said substrate to remove a portion of said substrate and to leave a portion of said substrate comprising a thin wall; and
   (c) providing a second removal step to substantially remove said thin wall, wherein said second removal step comprises a process different from said shining step (b).

2. A method as recited in claim 1, wherein said shining step (b) comprises the step of shining a focused ion beam.

3. A method as recited in claim 2, wherein said substrate comprises quartz.

4. A method as recited in claim 3, wherein in said providing step (a) said substrate comprises a defect, said defect comprising an unwanted quartz region.

5. A method as recited in claim 4, wherein said shining step (b) comprises the step of coring out a center portion of said unwanted quartz region, said thin wall surrounding said removed center portion.

6. A method as recited in claim 4, wherein said shining step (b) comprises the step of forming a plurality of trenches in said defect to leave a plurality of thin walls in said defect.

7. A method as recited in claim 4, wherein said defect comprises a divot and wherein said shining step (b) comprises the step of shining a focused ion beam to remove quartz surrounding said divot, said thin wall surrounding said divot.

8. A method as recited in claim 1, wherein said further processing step (c) comprises isotropically etching said thin wall.

9. A method as recited in claim 1, further comprising the step of providing a conductive coating before said shining step (b).

10. A method as recited in claim 9, wherein said further processing step (c) comprises isotropically etching said thin wall while said conductive coating remains in place to protect other portions of the mask during said isotropic etching step.

11. A method as recited in claim 1, wherein in said shining step (b) said beam is directed in a first direction to provide a wall extending in said first direction, said method futher comprising after said sputtering step (b) the step of FIB sputtering said thin wall with an ion beam, said ion beam aimed at an angle to said first direction.

12. A method as recited in claim 11, wherein said substrate comprises an approximately planar surface, said first direction being perpendicular to said approximately planar surface.

13. A method as recited in claim 12, wherein said angle is greater than 30 degrees.

14. A method as recited in claim 1, wherein in said shining step (b) said beam is directed in a first direction to provide a wall extending in said first direction, wherein said second removal step (c) comprises the step of shining a beam on said thin wall, said beam aimed at an angle to said first direction, said angle being greater than 10 degrees.

15. A method as recited in claim 14, wherein in said shining steps (b) and (c) said beam is a focused ion beam.

16. A method as recited in claim 14, wherein said angle is greater than 30 degrees.

17. A method of repairing a mask comprising the steps of:
   (a) providing a mask substrate having a defect, the substrate having a substantially planar surface, there being a normal to said planar surface; and
   (b) shining a beam on said defect, said beam aimed at an angle greater than 10 degrees to said normal to repair sold defect.

18. A method as recited in claim 17, wherein said substrate further comprises a non-transmissive layer adjacent said defect, said non-transmissive layer being on a plane, said plane being above said defect, wherein in said shining step (b) said beam is capable of damaging said substrate, and further wherein in said shining step (b) said beam is aimed on said defect at said angle to said normal to provide said damage to said substrate substantially under said layer.

19. A method as recited in claim 17, wherein said substrate comprises quartz.

20. A method as recited in claim 19, wherein said defect comprises an unwanted extension of quartz adjacent a chrome line.

21. A method as recited in claim 17, wherein said shining step (b) comprises the step of shining a focused ion beam.

22. A method as recited in claim 17, wherein in said shining step (b) said angle is greater than 30 degrees.

23. A method as recited in claim 17, further comprising after said step (b) the step of isotropically etching.

24. A method as recited in claim 17 further comprising the step of providing a conductive coating before said shining step (b).

25. A method as recited in claim 24, further comprising after said step (b) the step of isotropically etching wherein said conductive coating remains in place to protect other portions of the mask during said isotropic etching step.

26. A method of repairing an alternating phase shift mask comprising the steps of:

(a) providing a mask substrate having a surface, said surface comprising a first transparent region and a second transparent region, there being an optical thickness difference to provide a phase shift there between; and (b) shining a beam on said first region and on said second region to remove a portion of said substrate in said first region and in said second region, said portions of said substrate remaining retaining said optical thickness difference and said phase shift there between when said removing step is complete.

27. A method as recited in claim 26, wherein said first region comprises a divot defect, said divot defect having a depth, and wherein in said shining step (b) said portion of said substrate in said first region being a portion surrounding said divot defect.

28. A method as recited in claim 27, wherein said shining step (b) removes said substrate surrounding said defect to approximately said depth.

29. A method as recited in claim 28, wherein said shining step (b) leaves a thin wall surrounding said defect.

30. A method as recited in claim 29, further comprising the step of removing said thin wall.

31. A method as recited in claim 30, wherein said thin wall removing step comprises an isotropic etch.

32. A method as recited in claim 26, further comprising the step of providing a conductive coating before said shining step (b).

33. A method as recited in claim 32, further comprising after said step (b) the step of isotropically etching wherein said conductive coating remains in place to protect other portions of the mask during said isotropic etching step.

34. A method as recited in claim 26, wherein said shining step (b) comprises the step of shining a focused ion beam.

35. A method as recited in claim 26, wherein said substrate being removed comprises a homogeneous material.

36. A method as recited in claim 35, wherein said material comprises quartz.

* * * * *